United States Patent

[11] 3,621,473

[72] Inventor C. Daniel W. Stoffer
Don Mills, Ontario, Canada
[21] Appl. No. 8,259
[22] Filed Feb. 3, 1970
[45] Patented Nov. 16, 1971
[73] Assignee Collins Radio Company
Cedar Rapids, Iowa

[54] BALANCED MODULATOR WITH JFET'S VOLTAGE CONTROLLED RESISTORS
4 Claims, 2 Drawing Figs.

[52] U.S. Cl. .................................................. 332/23, 307/251, 307/304, 330/35, 332/16 T, 332/44
[51] Int. Cl. .................................................. H03c 3/00
[50] Field of Search .......................................... 332/16, 16 T, 23, 44, 43 B; 307/251, 279, 304; 330/9, 35

[56] References Cited

UNITED STATES PATENTS

| | | | |
|---|---|---|---|
| 3,454,850 | 7/1969 | Miller | 307/251 X |
| 3,383,601 | 5/1968 | Squires | 332/43 B X |
| 2,844,795 | 7/1958 | Herring | 332/16 T |
| 3,202,940 | 8/1965 | Dietrich | 332/31 T X |
| 2,972,120 | 2/1961 | Kircher et al. | 322/16 T X |
| 3,371,290 | 2/1968 | Kibler | 332/23 |

*Primary Examiner*—Alfred L. Brody
*Attorneys*—Warren H. Kintzinger and Robert J. Crawford

ABSTRACT: A balanced modulator up-translating an audio input signal to carrier sidebands with the carrier suppressed in the output via two field effect transistors used as voltage controlled resistors in a series shunt configuration.

Figure 1:
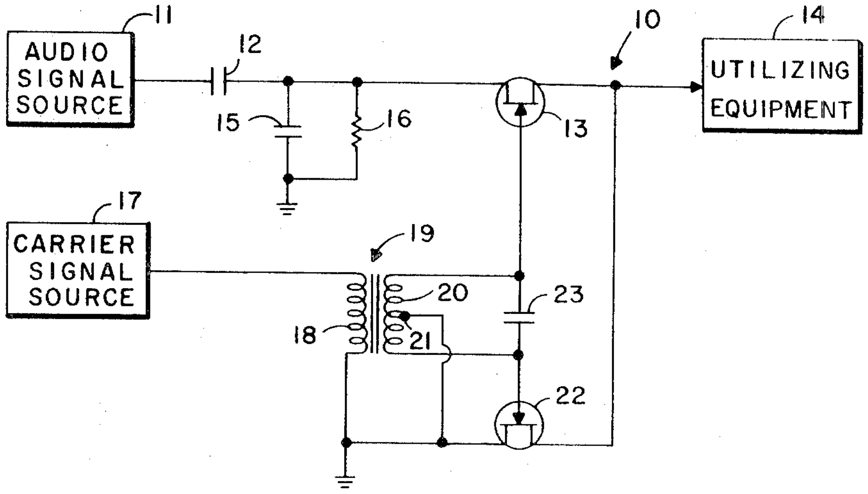

INVENTOR.
C. DANIEL W. STOFFER

BY Warren H. Kinzinger
ATTORNEY

BALANCED MODULATOR WITH JFET'S VOLTAGE CONTROLLED RESISTORS

This invention relates in general to balanced modulators, and in particular, to a balanced mixer using field effect transistors as voltage controlled resistors in a series shunt configuration.

Problems are encountered with many conventional modulator circuits particularly when exacting service demands are imposed such as, for example, to up-translate a baseband audio signal to a 450 kHz. IF signal with intermodulation distortion ≤-40 db., carrier rejection ≥40 db. and with a minimum of adjustments. Such requirements preclude the use of many modulator circuits since precision parts and/or adjustments are necessary with many modulator circuit systems in the attainment of the desired operational results. Some of these modulator circuits employ FET's or diodes in a switching mode but, many of the problems remain.

It is therefore, a principal object of this invention to provide a modulator circuit capable of up-translating a baseband audio signal to high in the IF kHz. signal range with minimal intermodulation distortion, excellent carrier rejection and a minimum of circuit adjustment.

Another object is to provide such a modulator that is a balanced modulator having the circuit symmetrical to the carrier frequency with the audio input RF ground referenced.

Features of the invention useful in accomplishing the above objects include, in the balanced mixer circuit, two field effect transistors used as voltage controlled resistors in a series shunt configuration. This is with gate-drain capacitive carrier leakage being effectively cancelled out in the balanced circuit configuration employed. Furthermore, the circuit is symmetrical to the carrier frequency since the audio input signal path connected to one of the FET's is held at RF around via a capacitor connected between the input to the FET receiving the audio input and ground. It is a circuit with the up-translated to sidebands output the product of two inputs (an audio frequency and a carrier frequency).

A specific embodiment representing what is presently regarded as the best mode of carrying out the invention is illustrated in the accompanying drawing.

Figure 2:
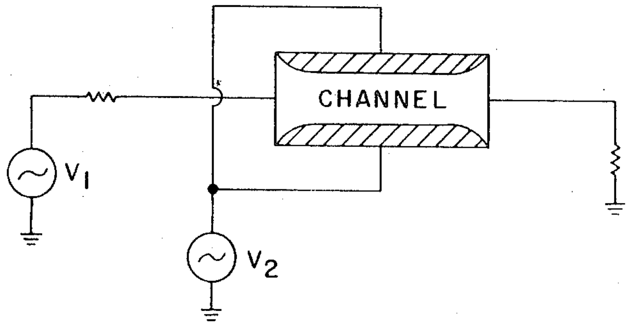

In the drawing:

FIG. 1 represents a combination block and schematic showing of applicants' balanced modulator circuit; and, FIG. 2 a diagrammatic representation of a JFET in the voltage controlled resistor mode.

Referring to the drawing:

The balanced modulator circuit 10, of FIG. 1, is shown to be fed an audio input signal from audio signal source 11 through audio signal coupling capacitor 12 to the source electrode of FET 13 that in a specific circuit embodiment thereof is JET (junction field effect transistor). The drain electrode of FET 13 is connected in the output of the circuit to utilizing circuitry 14. The junction of capacitor 12 and the source electrode of FET 13 is connected through capacitor 15 and resistor 16, in parallel, to ground. The carrier signal for the modulator mixer circuit 10 is supplied by carrier signal source 17 connected through the primary coil 18, of transformer 19, to ground. The secondary coil 20, of transformer 19 is a center tap 21 grounded secondary coil with opposite ends connected to the control electrode gates of respectively FET's 13 and 22 and also interconnected through capacitor 23. FET 22 is also, along with FET 13, a JFET in a specific circuit embodiment that has been put to use quite effectively.

In operation of the circuit of FIG. 1 using JFET's a 450 kHz. carrier injection signal translates the audio signal input to double sidebands at 450 kHz. This is with the signal applied at the control electrode gates of the FET's 13 and 22 being the 450 kHz. signal at approximately 500 mv. peak to peak. Thus, since the peak swing is below the junction voltage of silicon there is, advantageously, negligible forward conduction at the gates and the FET's are operated in an unbiased depletion/enhancement mode and may be thought of as voltage controlled resistors with source drain resistance controlled by the carrier voltage. The gate electrode to drain electrode capacitive leakage of each of the FET'13 and 22 generally tends to be cancelled one by the other. Further, the circuit is symmetrical to the carrier frequency since the input at the source electrode of FET 13 is in effect held generally substantially at RF ground through the capacitor 15 connection and directly to ground through FET 22. Still further, with the carrier voltage applied to the gates being approximately 180°out of phase the current due to the carrier is approximately zero.

Please refer also to FIG. 2 for operation of a JFET in the voltage controlled resistor mode with channel conductance modulated by gate-channel voltage. The shaded depletion region is a function of the contact potential of the junction and the external bias $V_2$ applied from the respective end of transformer 19 secondary coil 20. For relatively small signals $V_2$, of less than 500 mv. peak-to-peak, the channel dimensions can be varied about some static value $R_o$ where:

$$R_o = \frac{q\mu WHp}{L}$$

| TERMS | |
|---|---|
| W—width | $q$=electric charge |
| H—height | $\mu$=carrier drift mobility |
| L—length | $p$=impurity density |

The external bias applied varies the H variable in the above equation to thereby permit operation of the JFET to be described by the following equation.

$$25R_{ds} \cong R_o - \left(\frac{\Delta R_o}{\Delta V_2}\right)_{V_1=0} X V_2$$

$R_{ds}$=Drain to source resistance
$V_1$= 0 (equation evaluated at $V_1$=0)
$V_2$=450 kHz—500 mV peak-to-peak Thus, with application to the embodiment shown by FIG. 1, $$V_o = \frac{R_{ds_2}}{R_{ds_1} + R_{ds_2}} V_1$$

$V_0$=signal output voltage
$V_1$=input signal voltage from source 11
$R_{ds_1}$=JFET 13 drain to source resistance
$R_{ds_2}$=JFET 22 drain to source resistance
and the FET's 13 and 22 form a voltage divider with the division ratio controlled by the carrier voltage, and since $$R_{ds} \cong R_o - \left(\frac{\Delta R}{\Delta V}\right) V_2$$

$$V_o \cong \frac{\left[R_{o_2}\left(\frac{\Delta R_{o_2}}{\Delta V_2}\right) V_2\right] V_1}{R_{o_2}\left(\frac{\Delta R_{o_2}}{\Delta V_2}\right) V_2 + R_{o_1} - \left(\frac{\Delta R_{o_1}}{\Delta V_2}\right)(-V_2)}$$

With reasonably matched FET's the following formula approximation may be made particularly with the source drain resistance of the FET's approximated by a constant resistance ($R_o$) minus a factor varying directly with the carrier voltage.

$$V_o \cong \frac{R_{o_2}}{R_{o_2} + R_{o_1}} V_1 - \frac{\left(\frac{\Delta R_{o_2}}{\Delta V_2}\right) V_1 V_2}{R_{o_1} + R_{o_2}}$$

Then with suitable and adequate filtering to remove the baseband term $$\left[\left(\frac{R_{o_2}}{R_{o_1}} + R_{o_2}\right) V_1\right]$$

the desired signal input product output term is available after filtering approached as a limit.

$$V_o \doteq \frac{\left(\frac{\Delta R_{o_2}}{\Delta V}\right)}{R_{o_1} + R_{o_2}} V_1 V_2$$

Please note that the circuit can be made to work quite satisfactorily with MOSFET's used in place of the JFET's 13 and 22 with biasing suitably modified in substantially the same way to attain the same desirable operational results.

Whereas this invention is here illustrated and described with respect to a specific embodiment thereof, it should be realized that various changes may be made without departing from the essential contributions to the art made by the teachings hereof.

I claim:

1. In a balanced modulator circuit for translating a first input signal by a second input signal to a different third signal frequency; two like first and second field effect semiconductor devices each having at least three electrode connections, first, second, and third electrodes; first input signal coupling means connected to the first electrode of said first semiconductor device; connection of the first electrode of said second semiconductor to a voltage potential reference source; second input signal coupling means connected to a primary coil of a transformer; said transformer having a tapped secondary coil with the tap connected to said voltage potential reference source, and with secondary coil opposite ends connected to, respectively, the second electrode connections of said first and second field effect semiconductor devices; with both said third electrode connections connected in common as signal output means; wherein said secondary coil opposite ends are interconnected through capacitive means; said first input signal coupling means provides an audio input path with said first input signal being an audio signal; and with the first electrode of said first semiconductor device connected through an RF coupling capacitor to said voltage potential reference source; and wherein said first and second field effect semiconductor devices are each a junction field effect transistor.

2. The balanced modulator circuit of claim 1, wherein an audio signal coupling capacitor is included in said first input signal coupling means; and resistive means is connected in parallel with said Rf coupling capacitor.

3. The balanced modulator circuit of claim 1, with said tapped secondary coil a center-tapped secondary coil; and with said voltage potential reference source ground.

4. The balanced modulator circuit of claim 3, wherein one end of said transformer primary coil is connected to said second input signal coupling means and the other end of the primary coil is connected to ground; and with the second input signal a carrier signal.

* * * * *